(12) United States Patent
Joo

(10) Patent No.: US 7,393,744 B2
(45) Date of Patent: Jul. 1, 2008

(54) METHOD OF MANUFACTURING DIELECTRIC FILM OF FLASH MEMORY DEVICE

(75) Inventor: Kwang Chul Joo, Kyeongki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 157 days.

(21) Appl. No.: 11/294,990

(22) Filed: Dec. 6, 2005

(65) Prior Publication Data

US 2006/0292794 A1 Dec. 28, 2006

(30) Foreign Application Priority Data

Jun. 24, 2005 (KR) .................. 10-2005-0054977

(51) Int. Cl.
H01L 21/336 (2006.01)
(52) U.S. Cl. .............. 438/257; 438/258; 438/597; 438/E21.682; 438/E27.682
(58) Field of Classification Search ......... 438/257–258, 438/593–594, 201
See application file for complete search history.

(56) References Cited

U.S. PATENT DOCUMENTS 5,840,607 A * 11/1998 Yeh et al. .............. 438/257
6,074,917 A * 6/2000 Chang et al. ............ 438/261
2004/0005767 A1 * 1/2004 Dong ..................... 438/424
2004/0126972 A1 * 7/2004 Dong et al. ............. 438/259
2005/0186736 A1 * 8/2005 Joo ....................... 438/257
2005/0266640 A1 * 12/2005 You et al. ............... 438/261

FOREIGN PATENT DOCUMENTS

KR 2004-0046512 6/2004
KR 2004/0101927 12/2004
KR 2005/0004077 1/2005

* cited by examiner

Primary Examiner—Dung A. Le
(74) Attorney, Agent, or Firm—Marshall, Gerstein & Borun LLP

(57) ABSTRACT

A method of manufacturing a dielectric film of a flash memory device, including the steps of providing a semiconductor substrate having floating gates formed therein, performing an oxidization process in a decompression state to form a first oxide film of a thin film on the semiconductor substrate including the floating gates, and sequentially forming a nitride film and a second oxide film on the first oxide film to form a dielectric film having the first oxide film, the nitride film and the second oxide film.

17 Claims, 4 Drawing Sheets

OXIDIZATION UNDER DECOMPRESSION ATMOSPHERE

OXIDIZATION UNDER DECOMPRESSION ATMOSPHERE

STEAM ANNEAL

METHOD OF MANUFACTURING DIELECTRIC FILM OF FLASH MEMORY DEVICE

BACKGROUND OF THE INVENTION

1. Field of the Invention

The invention relates to a method of manufacturing a flash memory device, and more specifically, to a method forming a dielectric film formed between a floating gate and a control gate of a flash memory device.

2. Related Technology

Generally, the gate of the flash memory device has a structure including a tunnel oxide film 11, a floating gate 12, a dielectric film 13 and a control gate 14, all of which are formed on a silicon substrate 10, as shown in FIG. 1. Reference numeral 15 indicates an isolation film.

The program, erase and read operations of the flash memory device constructed above are performed in such a manner that electrons are injected into or drawn from the floating gate 12 by applying an adequate bias voltage to the control gate 14 and the silicon substrate 10.

The dielectric film 13 has an oxide-nitride-oxide (ONO) structure in which a first oxide film 13a, a nitride film 13b and a second oxide film 13c are stacked. Of them, the first and second oxide films 13a and 13c are formed by means of a dichlorosilane ($SiH_2Cl_2$)-based chemical vapor deposition (CVD) method. The CVD oxide film formed by CVD, however, has a lower film quality than an oxide film formed by means of a common dry and wet oxidization method.

The dielectric film 13 greatly affects the operation of the flash memory device. More particularly, a thickness and film quality of the first oxide film 13a has a significant influence on charge leakage and retention characteristics of the flash memory device.

In the design rule of 70 nm or less, a distance between the floating gates 12 is very narrow, i.e., 10 nm or less. If the dielectric film 13 is formed to have an existing thickness, voids A are caused in the dielectric film 13 since between-the-floating gates 12 are not fully filled at the time of subsequent deposition of polysilicon for control gate. These voids A generate poly residue between cells in a subsequent gate etch process, resulting in generation of bridges among the cells.

In order to prevent generation of these voids, it is necessary to thinly deposit the dielectric film 13 because a space between the floating gates 12 has to be secured. If the thickness of the first oxide film 13a is reduced, however, there is a problem in that a data retention characteristic is degraded.

In order to form an oxide film having a good data retention characteristic and a uniform and thin thickness, it is preferred that a thermal oxidation process is employed.

A thermal oxidization process is usually performed at an atmospheric pressure in which a hydrogen ($H_2$) gas and an oxygen ($O_2$) gas are sufficiently supplied in order to induce a spark reaction. In the case where this thermal oxidization process is practiced on a silicon substrate that is not processed, an oxide film having good data retention characteristic and a thin thickness can be formed. If the thermal oxidization process is practiced on the floating gate 12 made of doped polysilicon not the silicon substrate that is not processed, excessive oxidization is generated along the grain boundary of the floating gate 12, which is thermally unstable. It is thus difficult to form an oxide film having a good data retention characteristic and a uniform and thin thickness.

SUMMARY OF THE INVENTION

An advantage of the invention is a method of manufacturing a dielectric film of a flash memory device in which a dielectric film having a good charge retention characteristic and a uniform and thin thickness is formed.

Another advantage of the invention is to prevent generation of voids in a polysilicon film for control gate.

Still another advantage of the invention is to prevent formation of bridges among cells.

According to the invention, a method of manufacturing a dielectric film of a flash memory device, includes the steps of providing a semiconductor substrate having floating gates formed therein, performing an oxidization process in a decompression state to form a first oxide film of a thin film on the semiconductor substrate including the floating gates, and sequentially forming a nitride film and a second oxide film on the first oxide film to form a dielectric film having the first oxide film, the nitride film and the second oxide film.

Preferably, the oxidization process in the decompression state employs a wet oxidization process or a radical oxidization process in the decompression state.

Preferably, if the wet oxidization process in the decompression state is employed, a water vapor generator employing a catalyst can be used.

Preferably, the wet oxidization process in the decompression state can be performed at a pressure of 200 Torr to 700 Torr under an atmosphere including a large quantity of $H_2$ compared to $O_2$.

Preferably, the wet oxidization process in the decompression state can be performed at a pressure of 0.1 Torr to 200 Torr under an atmosphere including a large quantity of $O_2$ compared to $H_2$.

More preferably, the ratio of oxygen to hydrogen can be 1:1 to 15:1.

Preferably, the radical oxidization process can be performed at a pressure of 0.1 Torr to 1 Torr.

Preferably, the radical oxidization process can be performed under an atmosphere including a large quantity of $O_2$ compared to $H_2$.

More preferably, the amount of $H_2$ can be set below 40% of the total gas.

Preferably, the method can further include the step of performing a pre-treatment cleaning process of removing a native oxide film formed on surfaces of the floating gates, before the first oxide film is formed.

More preferably, at the time of the pre-treatment cleaning process, HF or buffered oxide etchant (BOE) can be used.

Preferably, the method can further include the step of performing a steam annealing process after the dielectric film is formed.

DETAILED DESCRIPTION OF PREFERRED EMBODIMENTS

The preferred embodiments according to the invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

FIGS. 2a to 2i are sectional views for explaining a method of manufacturing a flash memory device according to an embodiment of the invention.

Figure 1:
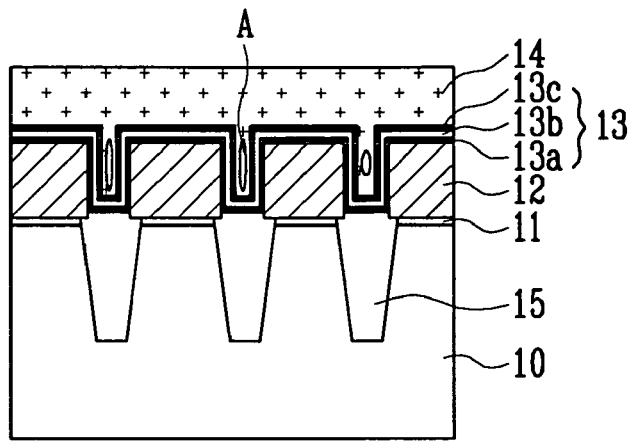
FIG. 1 is a sectional view of a flash memory device in the prior art.
Figure 2A:
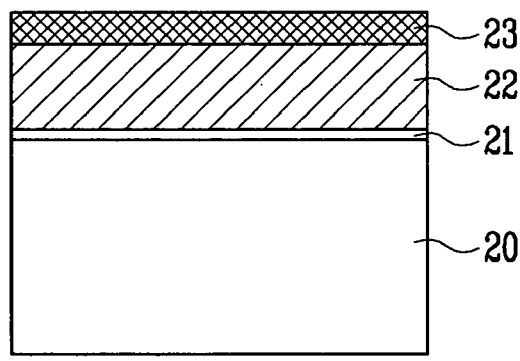
FIGS. 2a to 2i are sectional views for explaining a method of manufacturing a flash memory device according to an embodiment of the invention.

As shown in FIG. 2a, a screen oxide film 21 is formed on a semiconductor substrate 20. Ion implant processes such as a well ion implant process and a threshold voltage ion implant process are then performed.

Before the screen oxide film 21 is formed, a pre-treatment cleaning process can be preferably performed using a mixture of HF and SC-1 ($NH_4OH/H_2O_2/H_2O$) which are diluted with distilled water in the ratio of 50:1, or a mixture of BOE and SC-1 which are diluted with distilled water in the ratio of 100:1 or 300:1.

The screen oxide film 21 can be formed to a thickness of 50 Å to 80 Å at a temperature of 750° C. to 800 °C. by means of wet or dry oxidization mode.

A pad nitride film 22 and a hard mask oxide film 23 are then formed on the screen oxide film 21. The pad nitride film 22 is formed by means of low pressure chemical vapor deposition (LPCVD) and has a thickness of 1000 Å to 2000 Å in consideration of the height of a floating gate to be formed subsequently.

Figure 2B:
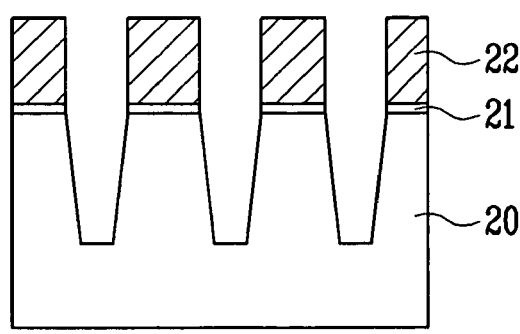

As shown in FIG. 2b, in order to define an isolation region, the hard mask oxide film 23 is patterned by means of a photolithography process.

The pad nitride film 22, the screen oxide film 21 and the semiconductor substrate 20 are then etched using the patterned hard mask oxide film 23 as an etch mask, forming trenches 24 and removing the hard mask oxide film 23.

Thereafter, a dichlorosilane ($SiH_2Cl_2$) hot temperature oxide (hereinafter, referred to as "DCS HTO") film of 100 Å to 200 Å in thickness is deposited on the semiconductor substrate 20 having the trenches 24 formed therein by LPCVD at a pressure of 0.1 Torr to 1 Torr and a temperature of 800° C. to 830° C., forming a sidewall oxide film (not shown).

Before the sidewall oxide film is formed, a pre-treatment cleaning process using a mixture of HF and SC-1($NH_4OH/H_2O_2/H_2O$) which are diluted with distilled water in the ratio of 50:1, or a mixture of BOE and SC-1 which are diluted with distilled water in the ratio of 100:1 or 300:1 can be preferably performed.

Figure 2C:
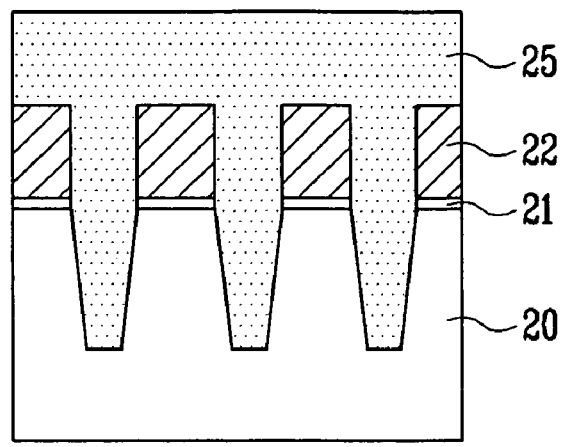

As shown in FIG. 2c, an isolation oxide film 25 is deposited on the entire surface of the semiconductor substrate 20 so that the trenches 24 are completely buried. Seams and voids that are naturally generated in the isolation oxide film 25 are removed by means of a high-temperature steam anneal process.

The isolation oxide film 25 can be formed using one of a high-density plasma (HDP) oxide film, an $O_3$-TEOS(HARP: High Aspect Ratio Planarization) oxide film and a polysilazane (PSZ) oxide film.

Figure 2D:
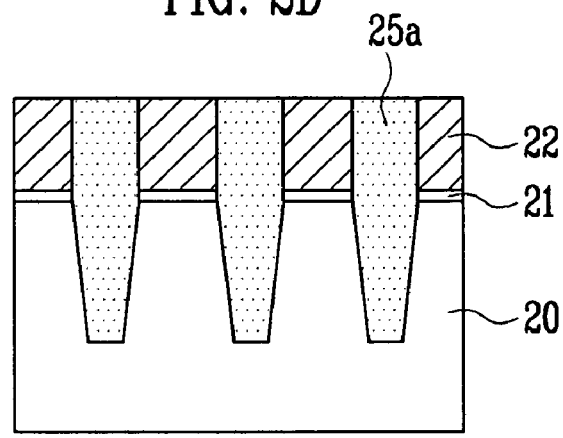

Referring to FIG. 2d, a chemical mechanical polishing (CMP) process using the pad nitride film 22 as a target is performed on the isolation oxide film 25, thus forming isolation films 25a in the trenches 24. At the time of the CMP process, a thickness of the pad nitride film 22, which is a target, is decided considering the height of the floating gate.

Figure 2E:
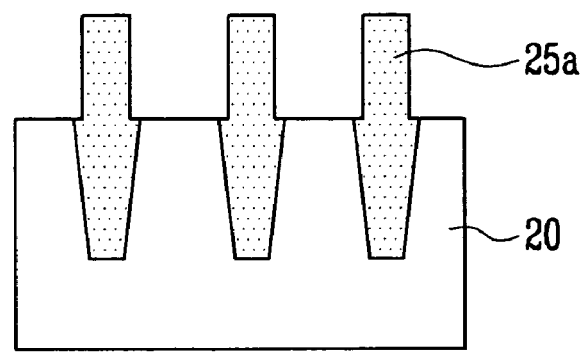

Referring to FIG. 2e, the pad nitride film 22 is removed using a phosphoric acid ($H_3PO_4$)solution. A portion of the isolation films 25a, which is projected higher than the surface of the semiconductor substrate 20, is exposed due to the removal of the pad nitride film 22. As such, the portion of the isolation films 25a, which is projected higher than the surface of the semiconductor substrate 20, is called an isolation film nipple.

Thereafter, the screen oxide film 21 is removed by means of a cleaning process using a mixture of HF and SC-1 ($NH_4OH/H_2O_2/H_2O$) which are diluted with distilled water in the ratio of 50:1, or a mixture of BOE and SC-1 which are diluted with distilled water in the ratio of 100:1 or 300:1. At this time, the isolation film nipple is also etched to secure a space where the floating gate will be formed.

Figure 2F:
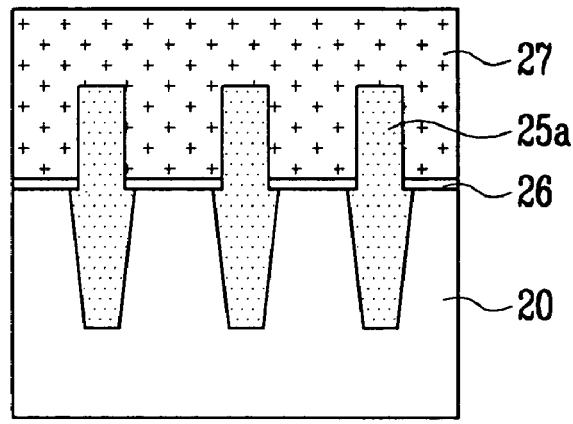

Referring to FIG. 2f, a tunnel oxide film 26 is formed on the semiconductor substrate 20 of an active region exposed through the removal of the screen oxide film 21.

In this case, the tunnel oxide film 26 is formed by means of wet oxidization mode at a temperature of 750° C. to 800° C.

In this case, in order to minimize the defect density at the interface between the semiconductor substrate 20 and the tunnel oxide film 26, an annealing process can be preferably performed under a nitrogen ($N_2$) gas atmosphere at a temperature of 900° C. to 1000° C. for 20 minutes to 30 minutes, after the tunnel oxide film 26 is formed.

Alternately, in order to minimize the defect density at the interface between the semiconductor substrate 20 and the tunnel oxide film 26, after the tunnel oxide film 26 is formed, an annealing process using $N_2O$ or NO gas can be performed at a temperature of 900° C. to 1000° C. for 5 minutes to 6 minutes to remove trap charges. within the tunnel oxide film 26, and an annealing process using a nitrogen ($N_2$) gas can be then performed at a temperature of 900° C. to 1000° C.

The annealing process using the $N_2O$ or NO gas can be carried out in-situ or ex-situ along with the formation process of the tunnel oxide film 26.

A doped polysilicon film 27 is deposited using $SiH_4$ or $Si_2H_6$ and $PH_3$ by LPCVD at a pressure of 0.1 Torr to 3 Torr and a temperature of 480° C. to 620° C. A doping concentration of the polysilicon film 27 can be preferably about 3E20 to 5E20 atoms/cc.

Figure 2G:
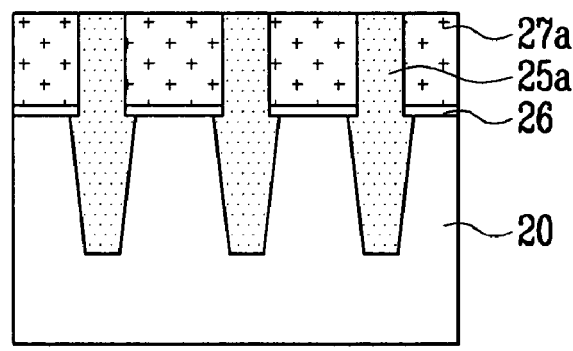

Referring next to FIG. 2g, the polysilicon film 27 undergoes CMP so that the isolation films 25a are exposed, thus forming a number of floating gates 27a isolated with the isolation films 25a therebetween.

Figure 2H:
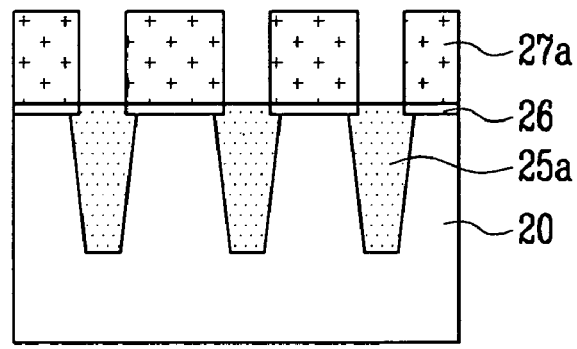

As shown in FIG. 2h, in order to improve the coupling ratio and minimize inter-cell interference, the isolation film 25a nipples are etched. At this time, it is preferred that the surface of the isolation films 25a is not lower than the tunnel oxide film 26.

A post-cleaning process using BON [($H_2SO_4+H_2O_2$+ BOE+SC-1] is then performed. In order to remove a native oxide film formed on the floating gates 27a, a pre-treatment cleaning process using a HF or BOE solution is performed.

Figure 2I:
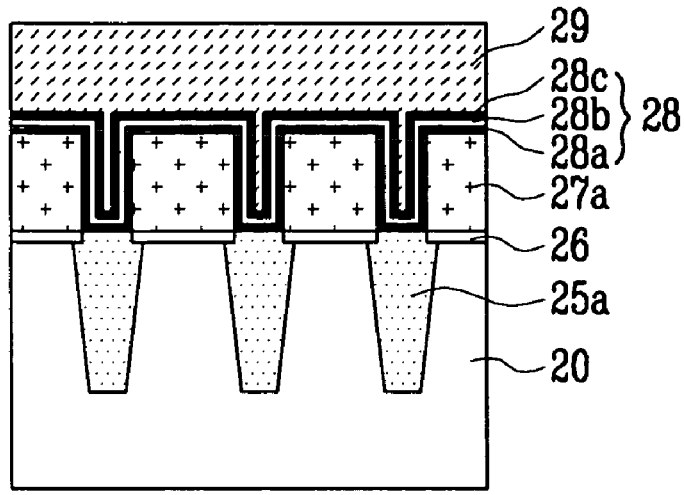

Thereafter, as shown in FIG. 2i, a dielectric film 28 is formed by means of the method of manufacturing the dielectric film according to the present invention.

The method of manufacturing the dielectric film according to the present invention will now be described.

Figure 3A:
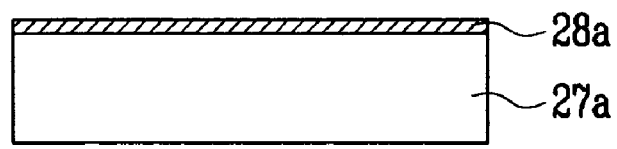
FIGS. 3a and 3b are sectional views for explaining a method of forming a dielectric film according to the present invention.
Figure 3B:
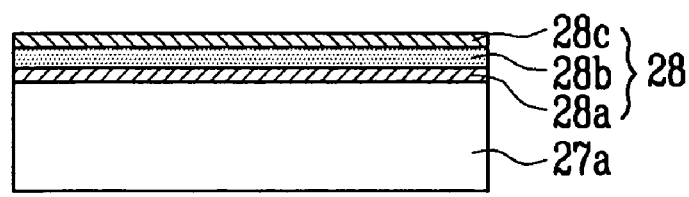

FIGS. 3a and 3b are sectional views for explaining a method of forming a dielectric film according to the invention.

As shown in FIG. 3a, a DCS HTO film is deposited on the floating gates 27a by means of an oxidization process under a decompression atmosphere to form a first oxide film 28a. The first oxide film 28a is preferably formed to a thickness of 20 Å to 180 Å.

The oxidization process under the decompression atmosphere can employ a wet oxidization process or a radical oxidization process under a decompression atmosphere.

In the case of a typical wet oxidization process, $H_2O$ is generated using a heater type or ramp type torch. The amount of $H_2$ and $O_2$ is short in the decompression state. It is thus impossible to induce an oxidization reaction since a spark reaction is not generated.

In contrast, in the invention, a water vapor generator (WVG) employing a catalyst is used to induce a spark reaction with a small amount of $H_2$ and $O_2$, thus generating $H_2O$. A wet oxidization process in the decompression state is made possible so that a spark reaction can be induced even at a low pressure of 0.1 Torr to 700 Torr.

The wet oxidization process in the decompression state can be performed at a pressure of 200 Torr to 700 Torr under an atmosphere including a large quantity of $H_2$ compared to $O_2$, or can be performed at a pressure of 0.1 Torr to 200 Torr under an atmosphere including a large quantity of $O_2$ compared to $H_2$ with the ratio of $H_2 : O_2$ is 1:1 to 1:15.

Meanwhile, in the case of the radical oxidization process, an oxide film is formed under a rapid decompression atmosphere of 0.1 Torr to 1 Torr using radicals (O*, H*, OH*) having a high activity, unlike the wet oxidization process using the spark reaction. In this case, an atmosphere including a large quantity of $O_2$ compared to $H_2$ is formed. At this time, the ratio of $H_2$ is preferably kept to 40% or less of the entire gas.

As such, in the case where the wet oxidization process or the radical oxidization process is used in the decompression state, the thickness of the oxide film can be controlled to be thin even at high temperature. It is therefore possible to form the first oxide film 28a having a good charge retention characteristic and a uniform and thin thickness even at the ground boundary of the floating gates 27a, which is thermally unstable.

Thereafter, as shown in FIG. 3b, a nitride film 28b having a thickness of 20 Å to 100 Å and a second oxide film 28c having a thickness of 20 Å to 100 Å are sequentially formed on the first oxide film 28a, thereby forming the dielectric film 28.

In order to make dense the dielectric film 28 and remove pin holes existing in the nitride film 28b, a wet anneal process is performed.

As shown in FIG. 2i, a polysilicon film 29 for control gate is formed on the entire surface by LPCVD using $SiH_4$ or $Si_2H_6$ and $PH_3$ at a pressure of 0.1 Torr to 3 Torr and a temperature of 480° C. to 620° C. A tungsten silicide film (not shown) is then formed on the polysilicon film 29 for control gate.

In this case, the tungsten silicide film can be formed through the reaction of MS ($SiH_4$) or DCS ($SiH_2Cl_2$) and $WF_6$ having a low fluorine (F) content, a low post anneal stress and a narrow adhesion strength at a temperature of 300° C. to 500° C.

Thereafter, though not shown in the drawings, the tungsten silicide film, the polysilicon film 29 for control gate, the dielectric film 28 and the floating gates 27a are selectively patterned to form a gate.

The invention has the following effects.

Firstly, a dielectric film having a good charge retention characteristic and a uniform and thin thickness can be formed.

Secondly, since a dielectric film having a good charge retention characteristic can be formed, the reliability and production yield of devices can be improved.

Thirdly, since a dielectric film can be formed thinly, a space in which a polysilicon film for control gate will be buried can be secured. Accordingly, generation of voids in the polysilicon film for control gate can be prevented.

Fourthly, since generation of voids in the polysilicon film for control gate is prevented, generation of bridges among cells can be prevented.

What is claimed is:

1. A method of manufacturing a dielectric film of a flash memory device, comprising:
   providing a semiconductor substrate having floating gates formed therein;
   performing an oxidization process in a decompression state to form a first oxide film of a thin film on the semiconductor substrate including the floating gates, wherein the oxidation process comprises performing a wet oxidization process or a radical oxidization process in the decompression state; and
   sequentially forming a nitride film and a second oxide film on the first oxide film to form a dielectric film having the first oxide film, the nitride film and the second oxide film.

2. The method as claimed in claim 1, comprising performing the wet oxidization process in the decompression state at a pressure of 200 Torr to 700 Torr under an atmosphere including an excess of $H_2$ compared to $O_2$.

3. The method as claimed in claim 1, comprising performing the wet oxidization process in the decompression state at a pressure of 0.1 Torr to 200 Torr under an atmosphere including an excess of $O_2$ compared to $H_2$.

4. The method as claimed in claim 3, wherein the ratio of oxygen to hydrogen is 1:1 to 15:1.

5. The method as claimed in claim 1, comprising performing the radical oxidization process at a pressure of 0.1 Torr to 1 Torr.

6. The method as claimed in claim 1, comprising performing the radical oxidization process under an atmosphere including an excess of $O_2$ compared to $H_2$.

7. The method as claimed in claim 6, wherein $H_2$ comprises less than 40% of the total gas.

8. The method as claimed in claim 1, further comprising performing a pre-treatment cleaning process to remove a native oxide film formed on surfaces of the floating gates, before forming the first oxide film.

9. The method as claimed in claim 8, comprising using HF or buffered oxide etchant (BOE) at the time of the pre-treatment cleaning process.

10. The method as claimed in claim 1, further comprising performing a steam annealing process after the dielectric film is formed.

11. A method of manufacturing a dielectric film of a flash memory device, comprising:
    providing a semiconductor substrate having floating gates formed therein;
    performing an oxidization process in a decompression state to form a first oxide film of a thin film on the semiconductor substrate including the floating gates, wherein the oxidation process comprises performing a radical oxidization process in the decompression state or a wet oxidization process in the decompression state with a water vapor generator employing a catalyst; and sequentially forming a nitride film and a second oxide film on the first oxide film to form a dielectric film having the first oxide film, the nitride film and the second oxide film.

12. The method as claimed in claim 11, comprising performing the wet oxidization process in the decompression state at a pressure of 200 Torr to 700 Torr under an atmosphere including an excess of $H_2$ compared to $O_2$.

13. The method as claimed in claim 11, comprising performing the wet oxidization process in the decompression state at a pressure of 0.1 Torr to 200 Torr under an atmosphere including an excess of $O_2$ compared to $H_2$.

14. The method as claimed in claim 13, wherein the ratio of oxygen to hydrogen is 1:1 to 15:1.

15. The method as claimed in claim 11, further comprising performing a pre-treatment cleaning process to remove a native oxide film formed on surfaces of the floating gates, before forming the first oxide film.

16. The method as claimed in claim 15, comprising using HF or buffered oxide etchant (BOE) at the time of the pre-treatment cleaning process.

17. The method as claimed in claim 11, further comprising performing a steam annealing process after the dielectric film is formed.

* * * * *